(12) United States Patent
Kimura et al.

(10) Patent No.: US 8,576,144 B2
(45) Date of Patent: *Nov. 5, 2013

(54) TRANSISTOR CIRCUIT, DISPLAY PANEL AND ELECTRONIC APPARATUS

(75) Inventors: Mutsumi Kimura, Suwa (JP); Yojiro Matsueda, Chino (JP); Tokuroh Ozawa, Suwa (JP); Michael Quinn, London (GB)

(73) Assignee: Seiko Epson Corporation, Tokyo (JP)

( * ) Notice: Subject to any disclaimer, the term of this patent is extended or adjusted under 35 U.S.C. 154(b) by 1838 days.

This patent is subject to a terminal disclaimer.

(21) Appl. No.: 11/490,239

(22) Filed: Jul. 21, 2006

(65) Prior Publication Data

US 2006/0256047 A1    Nov. 16, 2006

Related U.S. Application Data

(62) Division of application No. 10/384,756, filed on Mar. 11, 2003, now Pat. No. 7,173,584, which is a division of application No. 10/067,763, filed on Feb. 8, 2002, now abandoned, which is a division of application No. 09/424,043, filed as application No. PCT/JP99/01342 on Mar. 17, 1999, now Pat. No. 6,362,798.

(30) Foreign Application Priority Data

Mar. 18, 1998 (JP) ........................... 10-69147

(51) Int. Cl.
  *G09G 3/30* (2006.01)
  *G09G 3/32* (2006.01)
  *G09G 5/00* (2006.01)

(52) U.S. Cl.
  USPC .................... 345/76; 345/82; 345/214

(58) Field of Classification Search
  USPC ................ 345/78, 82, 208, 76, 87, 214; 315/169.3, 169.1, 169.2, 169.4; 327/109, 76

See application file for complete search history.

(56) References Cited

U.S. PATENT DOCUMENTS 3,875,430 A    4/1975    Prak
4,020,367 A    4/1977    Yamashiro et al.
(Continued)

FOREIGN PATENT DOCUMENTS

CN    1144912 A    3/1997
JP    61-201315    9/1986
(Continued)

OTHER PUBLICATIONS

U.S. Appl. No. 65/627,557, filed May 1997, Yamaguchi et al.

(Continued)

*Primary Examiner* — Dwayne Bost
*Assistant Examiner* — Robert Michaud
(74) *Attorney, Agent, or Firm* — Oliff & Berridge, PLC

(57) ABSTRACT

A transistor circuit is provided including a driving transistor where conductance between the source and the drain is controlled in response to a supplied voltage, and a compensating transistor where the gate is connected to one of the source and the drain, the compensating transistor being connected so as to supply input signals to the gate of the driving transistor through the source and drain. In a transistor circuit where conductance control in a driving transistor is carried out in response to the voltage of input signals, it is possible to control the conductance by using input signals of a relatively low voltage and a variance in threshold characteristics of driving transistors is compensated. With this transistor circuit, a display panel that can display picture images with reduced uneven brightness is achieved.

6 Claims, 12 Drawing Sheets

(56) References Cited

U.S. PATENT DOCUMENTS

| | | | | |
|---|---|---|---|---|
| 4,327,321 | A | 4/1982 | Suzuki et al. | |
| 4,385,292 | A | 5/1983 | Nonomura et al. | |
| 4,399,374 | A | 8/1983 | Boeke | |
| 4,432,610 | A | 2/1984 | Kobayashi et al. | |
| 4,471,347 | A | 9/1984 | Nakazawa et al. | |
| 4,642,552 | A | 2/1987 | Suzuki et al. | |
| 4,716,356 | A | 12/1987 | Vyne et al. | |
| 4,727,309 | A | 2/1988 | Vajdic et al. | |
| 4,781,437 | A | 11/1988 | Shields et al. | |
| 4,937,517 | A | 6/1990 | Kurashima | |
| 4,996,523 | A * | 2/1991 | Bell et al. | 345/77 |
| 5,017,834 | A | 5/1991 | Farnsworth | |
| 5,111,195 | A | 5/1992 | Fukuoka et al. | |
| 5,336,879 | A | 8/1994 | Sauer | |
| 5,488,328 | A | 1/1996 | Ludwig et al. | |
| 5,541,544 | A | 7/1996 | Nakano | |
| 5,627,557 | A * | 5/1997 | Yamaguchi et al. | 345/90 |
| 5,714,968 | A | 2/1998 | Ikeda | |
| 5,739,682 | A | 4/1998 | Kay | |
| 5,742,129 | A * | 4/1998 | Nagayama et al. | 315/167 |
| 5,786,796 | A * | 7/1998 | Takayama et al. | 345/76 |
| 5,903,246 | A | 5/1999 | Dingwall | |
| 5,940,053 | A * | 8/1999 | Ikeda | 345/77 |
| 5,952,789 | A * | 9/1999 | Stewart et al. | 315/169.4 |
| 6,091,203 | A | 7/2000 | Kawashima et al. | |
| 6,115,017 | A | 9/2000 | Mikami et al. | |
| 6,229,506 | B1 | 5/2001 | Dawson et al. | |
| 6,229,508 | B1 * | 5/2001 | Kane | 345/82 |
| 6,278,426 | B1 | 8/2001 | Akiyama | |
| 6,362,798 | B1 | 3/2002 | Kimura et al. | |
| 6,373,106 | B2 | 4/2002 | Maki et al. | |
| 6,632,798 | B2 * | 10/2003 | Hamdi et al. | 514/27 |
| 7,173,584 | B2 * | 2/2007 | Kimura et al. | 345/78 |

FOREIGN PATENT DOCUMENTS

| | | |
|---|---|---|
| JP | 64-039757 | 1/1989 |
| JP | 64-39757 | 2/1989 |
| JP | 2-32615 | 2/1990 |
| JP | 02-148687 | 6/1990 |
| JP | 04-328791 | 11/1992 |
| JP | A-05-035207 | 2/1993 |
| JP | 5-94150 | 4/1993 |
| JP | 5-343924 | 12/1993 |
| JP | 08-054835 | 2/1996 |
| JP | 11-219146 | 8/1996 |
| JP | 08-227276 | 9/1996 |
| JP | 08-241057 | 9/1996 |
| JP | 9-222930 | 8/1997 |
| JP | 61-201315 | 9/1998 |
| JP | 10-319908 | 12/1998 |
| JP | 2002-514320 | 5/2002 |
| WO | WO 98/48403 | 10/1998 |

OTHER PUBLICATIONS

Search Report issued Aug. 22, 2006 in counterpart European Patent Application No. 05076578.3.
Office Action mailed Jul. 19, 2011 in U.S. Appl. No. 12/222,639.
Office Action dated Jul. 3, 2013 from U.S. Appl. No. 12/222,639.
U.S. Office Action dated Aug. 23, 2013 from U.S. Appl. No. 13/018,749.

* cited by examiner

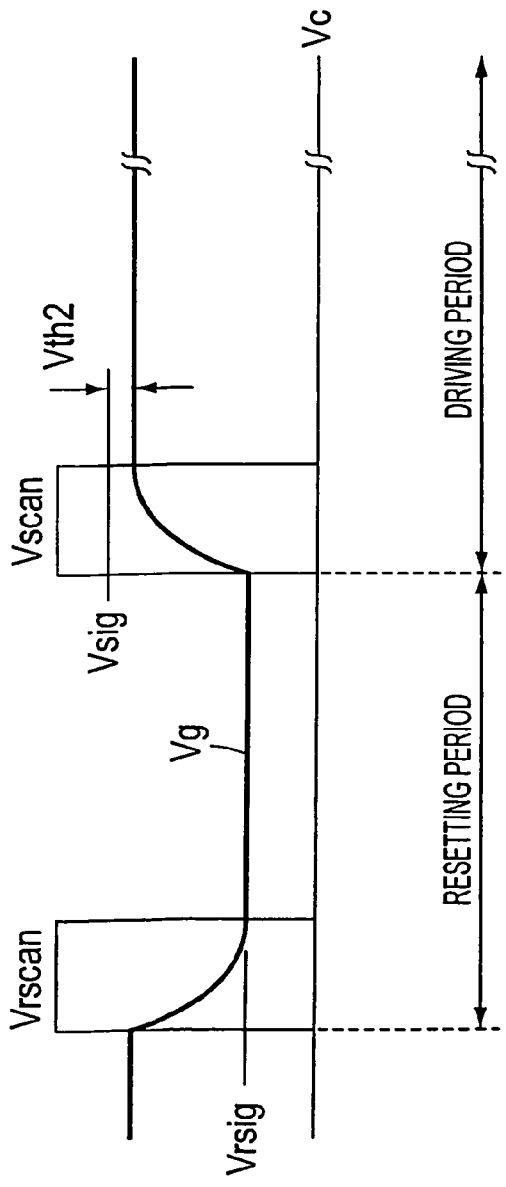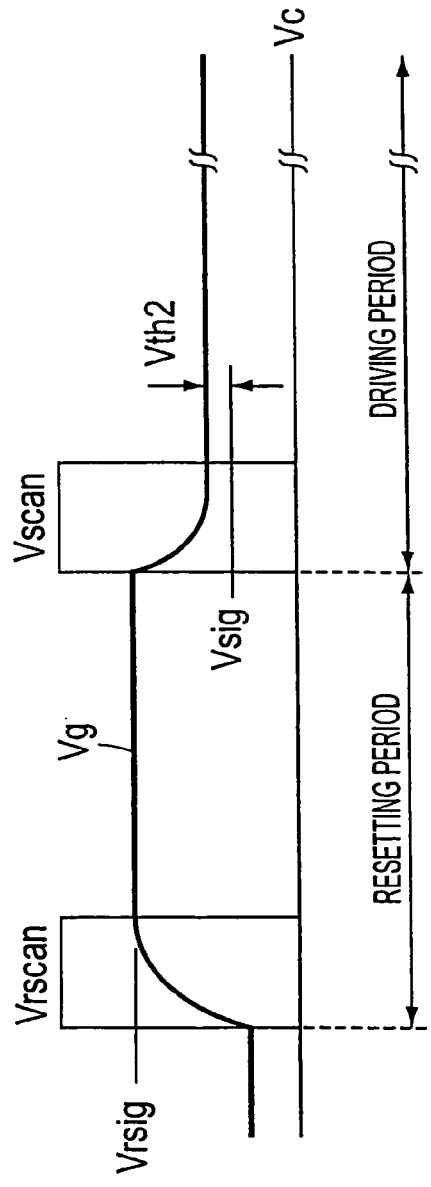
FIG. 2(A)
FIG. 2(B)

TRANSISTOR CIRCUIT, DISPLAY PANEL AND ELECTRONIC APPARATUS

This is a Divisional of U.S. patent application Ser. No. 10/384,756 filed on Mar. 11, 2003, which is a Divisional of U.S. patent application Ser. No. 10/067,763 filed on Feb. 8, 2002, which is a Divisional of U.S. patent application Ser. No. 09/424,043 filed on Nov. 18, 1999, which is a National Phase of PCT Application No. JP 99/01342 filed on Mar. 17, 1999, which are hereby incorporated by reference in their entirety. This application claims priority to Japanese Patent Application No. 10-69147 filed Mar. 18, 1998, which is hereby incorporated by reference in its entirety.

BACKGROUND OF THE INVENTION

1. Field of the Invention

This invention relates to the technical field of transistor circuits including a plurality of transistors such as thin-film transistors (mentioned as TFT hereafter), field effect transistors and bipolar transistors, and particularly relates to the technical field of transistor circuits including driving transistors for controlling driving current, by controlling conductance between the source and the drain in response to voltage supplied to the gate, that is supplied to a driven element such as a current-controlled (current-driven) element through the source and the drain.

2. Description of Related Art

Generally, the voltage/current characteristics and thresholds of transistors tend to vary, depending on various conditions such as the quality and thickness of semiconductor films, impurity concentration and diffusion areas, the quality, thickness and the like of gate insulating films, operating temperature, and the like. In the case of bipolar transistors consisting of crystal silicon, the variance of thresholds is relatively small, but in the case of TFTs, the variance is usually large. Particularly, in the case of TFTs formed in a wide range in plurality on a TFT array substrate in a display panel such as a liquid crystal panel, an EL panel, and the like, the variance in voltage/current characteristics and thresholds often becomes extremely large. For instance, when such TFTs are manufactured so as to set the threshold at about 2V (+2V in the case of N channel, and −2V in the case of P channel), the variance is sometimes about several ±V.

In the case of a voltage-controlled (voltage-driven) type transistor for controlling the voltage of picture elements made of liquid crystals or the like, such as a so-called TFT liquid crystal panel, the variance in voltage/current characteristics and thresholds of driving TFTs that are applied to each picture element is not likely to be a problem. In other words, in this case, even if there is a slight variance in the voltage/current characteristics and thresholds of TFTs, contrast and brightness of each picture element can be controlled at high precision by increasing the precision of the voltage supplied to each picture element from the outside through the TFTs only if there is enough switching time. Therefore, even in the case of a TFT liquid crystal panel or the like for display wherein contrast and brightness at each picture element are regarded as important, high grade picture images or the like can be displayed by TFTs with a relatively large variance of voltage/current characteristics and thresholds.

On the other hand, display panels have been recently developed that include current-controlled light-emitting elements, such as a self light-emitting organic ELs to change the brightness at picture elements in response to current supply. These display panels have received attention as display panels that can display picture images without back light and reflected light, that consume less power, being less dependent on the angle of view, and are sometimes flexible. Even in this EL panel, a driving TFT is used at each picture element for driving an active matrix. For instance, it is constructed so as to control (change) the driving current supplied to an EL element from power source wiring connected to a source in response to the voltage of data signals applied to a gate, by connecting the drain of a driving TFT to the EL element through a hole-injecting electrode. Using a driving TFT as mentioned above, driving current flowing to an EL element can be controlled by controlling conductance between a source and a drain in response to the voltage change of input signals, so that brightness at each picture element can be changed for picture image display and the like.

However, particularly in the case of the current-controlled element such as the EL panel mentioned above, the variance of voltage/current characteristics and thresholds tends to be a problem in the driving TFT at each picture element. In other words, in this case, even if the voltage precision of data signals supplied to the driving TFTs from the outside is enhanced to some extent, the variance in voltage/current characteristics and thresholds in the driving TFTs appears directly as the variance of the driving current supplied to data signals, thus reducing the precision of the driving current. As a result, the brightness at each picture element is likely to vary in accordance with the variance in thresholds of the driving TFTs. Moreover, especially with current manufacturing techniques of low temperature polysilicon TFTs, voltage/current characteristics and thresholds vary considerably. Thus, this problem is, in practicality, extremely serious.

If each TFT is manufactured so as to reduce the variance in voltage/current characteristics and thresholds in consideration of this problem, the yield will decline and, particularly in the case of an apparatus with a display panel having a plurality of TFTs, the yield will decrease a great extent, and thus opposing a general goal of lower costs. Alternatively, it is almost impossible to manufacture TFTs that can lower such a variance. Moreover, even if a circuit for compensating the variance of voltage/current characteristics and thresholds at each TFT is installed separately, the apparatus will be complex and large, and moreover, the consumption of electric power will increase. Particularly, in the case of a display panel wherein a plurality of TFTs are arranged at high density, the yield will decline again or it will be difficult to satisfy current demands such as lower power consumption, and miniaturization and lightening of an apparatus.

This invention is carried out in consideration of the above-noted problems, and aims to provide transistor circuits for controlling conductance in driving transistors in response to the voltage of input signals, the conductance of which can be controlled by relatively small input signals and that can compensate for the variance in voltage/current characteristics and thresholds of driving transistors with somewhat smaller power consumption by using a relatively small number of transistors, and a display panel and an electronic apparatus using the same.

In this invention, the following transistor circuits according to the first to tenth aspects are provided.

First, according to a first aspect of the invention a transistor circuit is characterized in that it includes a driving transistor having a first gate, a first source and a first drain, wherein conductance between the first source and first drain is controlled in response to the voltage of input signals supplied to the first gate, and a compensating transistor having a second gate, a second source and a second drain, wherein the second gate is connected to one of the second source and second drain, and wherein the compensating transistor is connected to the first gate in an orientation so as to supply the input signals to the first gate through the second source and second drain, and to allow the first gate to move electric charge into a direction to lower the conductance.

According to the above-noted transistor circuit of the first aspect of the invention, one of the second source and second drain of the compensating transistor is connected to the first gate of the driving transistor, and input signals are supplied to the first gate of the driving transistor through this second source and second drain. Then, at the driving transistor, the conductance between the first source and first drain is controlled in response to the voltage of input signals supplied to the first gate. Herein, the compensating transistor has the second gate connected to the second drain, and is connected to the first gate in an orientation to allow the first gate to move electric charge into a direction to lower the conductance between the first source and first drain. In other words, the compensating transistor has diode characteristics and when the driving transistor is, for example, an N-channel type transistor, current can be carried from the first gate into the direction of an input signal source. Alternatively, when the driving transistor is a P-channel type transistor, current can be carried from an input signal source to the direction of the first gate.

Therefore, as input signals are supplied to the transistor circuit, the gate voltage of the first gate, compared with the voltage of input signals at the time of being input to the compensating transistor, rises to the side of increasing the conductance of the driving transistor only by a threshold level of the compensating transistor. As a result, in order to obtain preferable conductance in the driving transistor, input signals of a voltage that is lower only by a threshold (voltage) level of the compensating transistor, instead of the gate voltage corresponding to the conductance, can be supplied through the compensating transistor. In this way, since the gate voltage in response to input signals can rise only by a threshold (voltage) of the compensating transistor, equivalent conductance control can be carried out by the lower voltage of input signals compared with the case of no compensating transistor.

These input signals are generally at a high frequency relative to other signals, and the consumption of electric power can be reduced significantly if lower input signals can be used.

Moreover, setting a gate voltage at the first gate by increasing the voltage of input signals from the compensating transistor as mentioned above indicates that, when seen as a transistor circuit as a whole, the threshold of input signals supplied to a driving current flowing through a source and a drain whose conductance is controlled in the driving transistor is lower than the threshold voltage of the driving transistor only by the threshold voltage of the compensating transistor as a voltage increases from the input voltage to the gate voltage. In other words, within the threshold of input voltage supplied to a driving current, the threshold of the compensating transistor and the threshold of the driving transistor are offset from each other. Therefore, by making the threshold characteristics and the voltage/current characteristics of both transistors similar to each other, it is possible to set the threshold of input signals to driving current to zero.

Moreover, by offsetting the threshold of the driving transistor and the threshold of the compensating transistor in the transistor circuit as a whole as mentioned above, the threshold of input signals can be set closer to a constant level (zero) without depending on the level of threshold of the driving transistor. In other words, when a plurality of transistor circuits is prepared by using many driving transistors with different thresholds, a difference in thresholds between transistor circuits is smaller than (or is ideally almost the same as) a difference in the thresholds of driving transistors by setting the thresholds of the driving transistor and the compensating transistor in each transistor circuit close to each other (ideally equal to each other). Thus, in preparing a plurality of transistor circuits, a plurality of transistor circuits with almost or completely no variance in thresholds can be provided even when many driving transistors with many different thresholds are used.

According to a second aspect of the invention, the transistor circuit according to the first aspect mentioned above is characterized in that it has a resetting means for supplying reset signals, having a voltage that gives higher conductance than the maximum conductance controlled in response to the input signals, to a first gate before the input signals are supplied.

According to the above-noted transistor circuit of the second aspect of the invention, before input signals are supplied to the first gate of a driving transistor (or after the input signals are supplied before the next input signals are supplied), reset signals, having a voltage which gives a higher conductance than the maximum conductance of the driving transistor controlled in response to input signals, are supplied to this first gate by the resetting means. As a result, the gate voltage of the driving transistor can be set constant without depending on the level of voltage of input signals. Moreover, it becomes possible to supply input signals to the first gate through the compensating transistor which is connected to the first gate in an orientation to permit electric charge to move into a direction so as to lower conductance after resetting.

According to a third aspect of the invention, the above-noted transistor circuits according to any of the first and second aspects, is characterized in that the reset signals are set at a voltage higher than the maximum voltage of input signals by a threshold voltage level of the compensating transistor.

According to the above-mentioned transistor circuit of the third aspect of the invention, reset signals having a higher voltage than input signals are supplied to the first gate of the driving transistor by the resetting means. Moreover, the voltage of these reset signals is set higher than the maximum voltage of the input signals by a threshold voltage of the compensating transistor, so that a voltage higher than the voltage of the input signals by a threshold voltage level of the driving transistor can always be supplied to the first gate of the driving transistor through the compensating transistor, without being dependent on the level of voltage of input signals or thresholds of the driving transistor, when input signals are input after resetting.

According to a fourth aspect of the invention, the transistor circuit according to the second aspect mentioned above, is characterized in that it includes a resetting transistor wherein the resetting means has a third gate, a third source and a third drain, wherein one of the third source and the third drain is connected to the first gate, and wherein the reset signals are supplied to the first gate through the third source and third drain after reset timing signals are supplied to the third gate before the supply of the input signals.

According to the above-noted transistor circuit of the fourth aspect of the invention, when reset timing signals are supplied to the third gate of the resetting transistor, reset signals are supplied to the first gate of the driving transistor through the third source and third drain by the resetting transistor. As a result, the gate voltage of the driving transistor can be reset at a constant by the timing of supplying reset timing signals. Therefore, the operations that are explained for the second transistor circuit become possible.

According to a fifth aspect of the invention, the transistor circuit according to any one of the first to the fourth aspects mentioned above, is characterized in that the driving transistor and the compensating transistor are the same type of transistors.

According to the transistor circuit of the fifth aspect of the invention mentioned above, the driving transistor and the compensating transistor are the same type of transistors, but the "same type" means that the conductive type of transistors is the same herein. For instance, when the driving transistor is an N channel type transistor, the compensating transistor is also an N channel type transistor. With the driving transistor as a P channel type transistor, the compensating transistor is also a P channel type transistor. Therefore, the threshold of the compensating transistor and the threshold of the driving transistor become almost equal to each other, so that these thresholds are offset from each other in the transistor circuit. As a result, it becomes possible to carry out conductance control by setting the threshold of input signals supplied to a driving current to approximately zero.

Also, by providing the same transistor channel width, design values including a channel length, device structures, process conditions, and the like to both the driving transistor and the compensating transistor, more complete compensation becomes possible.

According to the sixth aspect of the invention, the transistor circuit according to any of the above-noted first to the fifth aspects, is characterized in that the circuit further includes a switching transistor having a fourth gate, a fourth source and a fourth drain, and wherein the transistor is connected so as to supply the input signals to the compensating transistor through the fourth source and fourth drain when switching timing signals are supplied to the fourth gate.

According to the above-noted transistor circuit of the sixth aspect, when switching timing signals are supplied to the fourth gate of the switching transistor, input signals are supplied to the compensating transistor through the fourth source and fourth drain of the switching transistor. As a result, input signals can be supplied to the driving transistor by the supply timing of switching timing signals.

According to a seventh aspect of the invention, the transistor circuit according to any of the above-noted first to sixth aspects, is characterized in that it further includes a storage capacitor connected to the first gate.

According to the transistor circuit of the seventh aspect, when input signals are supplied to the first gate, the voltage is held by the storage capacitor connected to the first gate. Therefore, even when input signals are supplied only for a fixed period, the voltage at the first gate can be held over a longer period than the fixed period.

Also, even when there is leakage current in the switching transistor through the compensating transistor, it becomes possible to reduce the fluctuation of electric potential applied to the first gate.

According to an eighth aspect of the invention, the transistor circuit according to any of the above-noted first to seventh aspects, is characterized in that the transistors consist of thin-film transistors formed on the same substrate respectively.

According to the transistor circuit of the eighth aspect, the effect of voltage/current characteristics and threshold characteristics of the driving thin-film transistor, which is formed on the same substrate, on a driving current can be compensated by the compensating thin-film transistor. Particularly, as both thin-film transistors are formed on the same substrate in the same thin-film forming process, the characteristics between both transistors become similar, so that it becomes possible to provide a plurality of transistor circuits with little variance in voltage/current characteristics and threshold characteristics on the same substrate.

According to a ninth aspect of the invention, the transistor circuit according to any of the above-noted first to seventh aspect, is characterized in that the transistors consist of bipolar transistors respectively, wherein the gate, source and drain correspond to a base, a collector and an emitter respectively.

According to the transistor circuit of the ninth aspect, the effect of voltage/current characteristics and threshold characteristics of the driving bipolar transistor on a driving current can be compensated by the compensating bipolar transistor. Particularly, as both bipolar transistors are manufactured in the same manufacturing process, the degree of characteristic similarity between both transistors generally increases, so that it becomes possible to provide a plurality of transistor circuits with little variance in voltage/current characteristics and threshold characteristics.

According to a tenth aspect of the invention, the transistor circuit according to any of the above-noted first to ninth aspects, is characterized in that the input signals are voltage signals where the voltage is controlled by an input signal source and that the driving transistor, wherein one of the first source and first drain is connected to a current-controlled element, and electric current flowing to the current-controlled element is controlled by controlling the conductance.

According to the transistor circuit of the tenth aspect of the invention, as the voltage signals where a voltage is controlled by an input signal source are supplied through the compensating transistor as input signals, conductance between the first source and first drain is controlled in response to the change in voltage of these voltage signals in the driving transistor. As a result, the current-controlled element connected to one of the first source and first drain is current-controlled. Thus, it becomes possible to current-drive the current-controlled element by the input signals of a relatively low voltage. Moreover, it becomes possible to current-control a plurality of current-driven elements with good precision in response to voltage signals without being dependent on the variance in voltage/current characteristics and thresholds between a plurality of driving transistors.

According to this invention, a display panel is provided which is characterized in that it includes the above-noted tenth transistor circuit of this invention respectively and has a plurality of picture elements arranged in a matrix, and that current-controlled light-emitting elements are provided respectively to the plurality of picture elements as the current-controlled elements.

According to the display panel, as input signals are provided through the compensating transistor at each picture element, the current-controlled light-emitting elements are current-controlled in response to the voltage of these input signals by the driving transistor, so that the brightness of the current-controlled light-emitting elements can be controlled with good precision without being dependent on the variance in voltage/current characteristics and threshold characteristics among the driving transistors, and that the unevenness of brightness can be reduced over the entire screen display area of the display panel. Moreover, by increasing the gate voltage of the driving transistor with the compensating transistor, the current-controlled light-emitting elements can be controlled by the input signals of a relatively low voltage.

According to this invention, an electronic apparatus having the above-noted display panel is provided.

According to such an electronic apparatus, since it has the above-described display panel, an electronic device can be realized that has little unevenness in brightness over the entire surface of the display panel and can be driven at a relatively low voltage.

BRIEF DESCRIPTION OF THE DRAWINGS

FIG. 2(A) is a timing chart of various signals in a transistor circuit using p-channel transistors, and FIG. 2(B) is a timing chart of various signals in a modified embodiment of the transistor circuit using n-channel transistors.

DETAILED DESCRIPTION OF THE PREFERRED EMBODIMENTS

The operation of this invention and other benefits will be made clear by the embodiments explained below. The embodiments of this invention will be explained below with reference to the drawings.
(Transistor Circuit)

Figure 1:
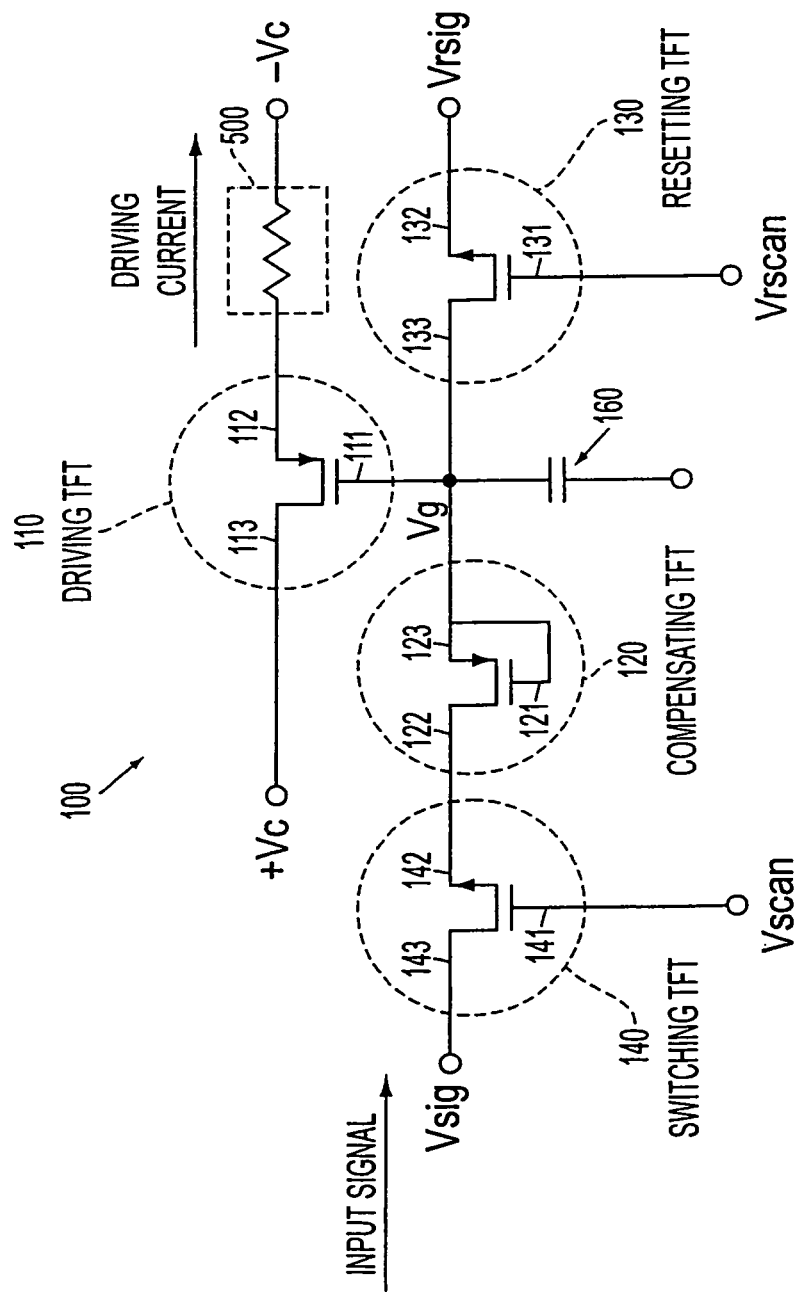
FIG. 1 is a circuit diagram in one embodiment of a transistor circuit of the invention.

First, the embodiment of a transistor circuit of this invention is explained with reference to FIG. 1 and FIGS. 2(A)-2(B). FIG. 1 is a circuit diagram of a transistor circuit in the embodiment, and FIG. 2(A) and FIG. 2(B) are timing charts showing the timing and voltage of various signals in the transistor circuit respectively.

In FIG. 1, a transistor circuit 100 may consist of a driving TFT 110 (P channel type), a compensating TFT 120 (P channel type), a resetting TFT 130 (N channel type) and a switching TFT 140 (N channel type). The structure of each transistor will be sequentially explained below.

First, the driving TFT 110, as an example of driving transistors, is constructed so as to control conductance between a source 112 and a drain 113 in response to a gate voltage Vg applied to a gate 111 based on input signals supplied through the switching TFT 140 and the compensating TFT 120.

The compensating TFT 120, as an example of compensating transistors, has its gate 121 connected to one of a source 122 and a drain 123 (drain 123 in the case of FIG. 1). In other words, the compensating TFT 120 is so-called diode-connected. Moreover, the compensating transistor 120 is connected to the gate 111 in an orientation so as to supply input signals to the gate 111 through the source 122 and the drain 123 and to allow the gate 111 to move electric charge into a direction to lower conductance (the side of drain 123 in FIG. 1).

The resetting TFT 130, an example of resetting devices, has one of a source 132 and a drain 133 (drain 133 in FIG. 1) connected to the gate 111, and reset signals at voltage Vrsig (called reset signals Vrsig hereafter) are supplied to the gate 111 through the source 132 and the drain 133 when reset scanning signals at voltage Vrscan (called reset scanning signals Vrscan hereafter) are supplied to the gate 131 as an example of reset timing signals before the supply of input signals Vsig.

Also, the switching TFT 140, an example of switching transistors, is connected between an input signal source and the compensating TFT 120 so as to supply input signals at voltage Vsig (called input signals Vsig hereafter) to the compensating TFT 120 through a source 142 and a drain 143 when scanning signals at voltage Vscan (called scanning signals Vscan hereafter) are supplied to the gate 141 as an example of switching timing signals.

Moreover, one terminal of a current-controlled (current-driven) element 500 such as an EL element is connected to the source 112 of the driving transistor 110, and negative power source −Vc with a predetermined electric potential is connected to another terminal of this current-controlled element 500. In addition, positive power source +Vc with a predetermined electric potential is connected to the drain 113 of the driving transistor 110. Therefore, when conductance between the source 112 and the drain 113 is controlled at the driving transistor 110, driving current Id flowing through the current-controlled element 500 is controlled (in other words, driving current Id varies in response to conductance fluctuation).

Furthermore, a storage capacitor 160 is connected to the gate 111 of the driving transistor 110. As a result, the once applied gate voltage Vg is held by the storage capacitor 160.

Then, the operation of the transistor circuit 100 constructed as above is explained with reference to FIG. 1 along with FIGS. 2(A)-3.

As shown in FIG. 2(A) (this figure shows that a P channel type TFT is applied to both the driving TFT 110 and the compensating TFT 120), the resetting TFT 130 will be in conductance when reset scanning signals Vrscan are input to the resetting TFT 130; and resetting signals Vrsig are then supplied to the gate 111 of the driving TFT 110, so that the gate voltage Vg of the gate 111 becomes almost the same as the voltage Vrsig of these reset signals Vrsig. As a result, without being dependent on the level of voltage of input signals Vsig, the gate voltage Vg of the driving TFT 110 can be reset at a fixed voltage (in other words, voltage Vrsig) by the supply timing of reset scanning signals Vrsig.

Then, as scanning signals Vscan are supplied to the switching TFT 140 after this resetting period, the switching TFT 140 will be in conductance and the driving signals Vsig are supplied to the gate 111 of the driving TFT 110 through the compensating TFT 120. In this embodiment, the gate 121 is connected (in other words, diode-connected) to the drain 123 particularly in the compensating TFT 120 herein, so that gate voltage Vg in the driving TFT 110, the P channel type TFT that will be in conductance by the application of negative voltage to the gate 111, is made lower than the voltage Vsig of data signals Vsig to the negative voltage side only by a threshold voltage Vth2 level of the compensating TFT 120. Then, the gate voltage Vg lowered as mentioned above will be held in a driving period by the storage capacitor 160 even after the supply of scanning signals Vscan and input signals Vsig is stopped.

In addition, the period in which gate voltage Vg becomes the voltage Vrsig of reset signals Vrsig is sufficient for the resetting period. Thus, the driving period can be set much longer than the resetting period, so that even if the driving TFT 110 is in conductance by resetting signals Vrsig in the resetting period, the effect on the driving current Id flowing through the source 112 and the drain 113 of the driving TFT 110 in this period can be minimized to a negligible degree.

As described above, according to this embodiment, gate voltage Vg relative to input signals Vsig can rise only by a threshold voltage Vth2 level of the compensating TFT 120, so that it becomes possible to carry out the same conductance control in the driving TFT 110 by using a lower input signal voltage Vsig compared with the case with no compensating TFT 120.

Also, FIG. 2(B) is a timing chart where an N channel type TFT is applied to both the driving TFT 110 and the compensating TFT 120. In this case, the gate voltage Vg at the driving TFT 110, the N channel type TFT that will be in conductance by the application of positive voltage to the gate 111, is made higher than the voltage Vsig of input signals Vsig to the positive voltage side only by a threshold Vth2 level of the compensating TFT 120 after being set at the voltage Vrsig of reset signals Vrsig during resetting.

Figure 3A:
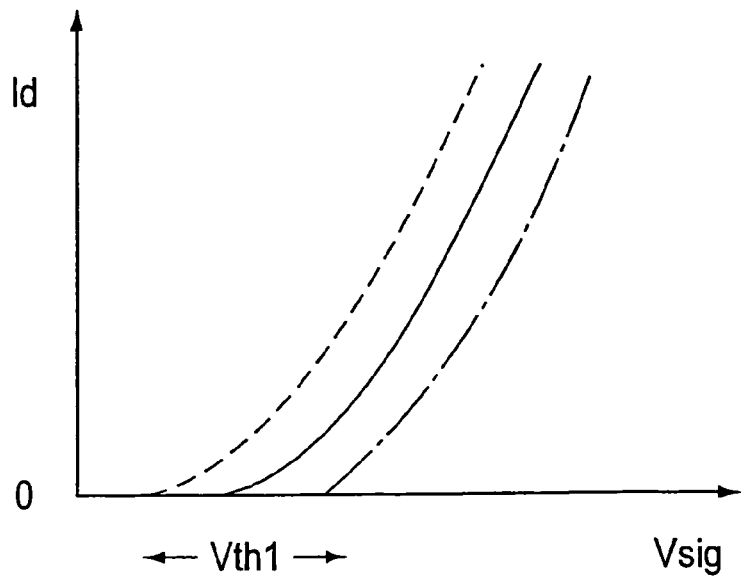
FIG. 3(A) is a characteristic diagram showing the threshold characteristics in a comparative example having a driving TFT.

If input signals Vsig are directly input to the driving TFT 110 without going through the compensating TFT 120, in other words, when the voltage Vsig of input signals Vsig is the same as the gate voltage Vg, the driving current Id is boosted from a threshold voltage Vth1 of the driving TFT 110 as shown in FIG. 3(A) (in this case, the driving TFT 110 is an N channel TFT). For example, if the design standard value of this threshold voltage Vth1 is 2V, a variance in thresholds will be about several +V. Then, a variance in threshold voltage Vth1 in the driving TFT 110 will appear directly as a variance in driving current Id.

Figure 3B:
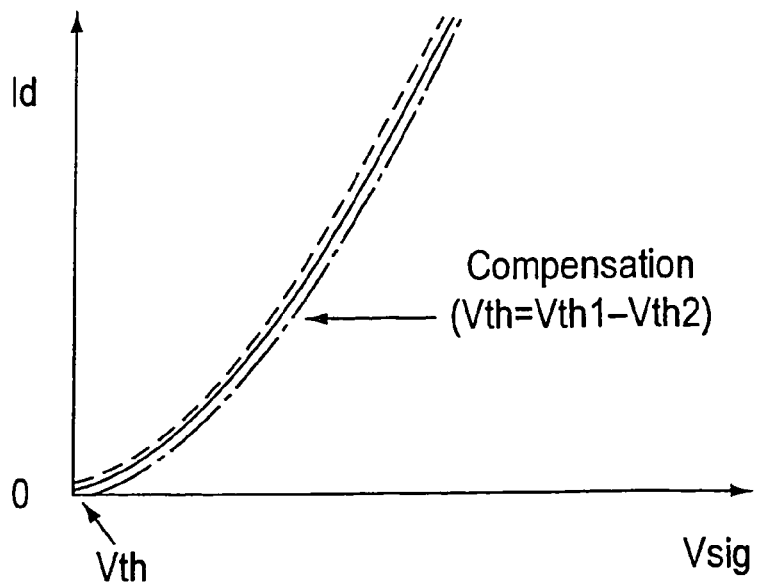
FIG. 3(B) is a characteristic diagram showing the threshold characteristics in the embodiment having a compensating TFT and a driving TFT.

On the contrary, in this embodiment, since input signals Vsig are input to the driving TFT 110 through the compensating TFT 120, in other words, when the voltage Vsig of input signals Vsig is boosted only by the threshold voltage Vth2 level of the compensating TFT 120 to become gate voltage Vg, the threshold voltage Vth2 of the compensating TFT 120 and the threshold voltage Vth1 of the driving TFT 110 are offset as shown in FIG. 3(B) (in this case, both the driving TFT 110 and the compensating TFT 120 are N channels TFTS) and the threshold voltage Vth of the input signals Vsig to the entire transistor circuit 100 then becomes approximately zero. Moreover, particularly when both threshold voltages Vth1 and Vth2 are nearly the same, this threshold voltage Vth becomes approximately zero. Thus, equalizing threshold voltage Vth1 to Vth2 can be relatively easily carried out e.g., by applying the same conductive type TFT to the driving TFT 110 and the compensating TFT 120 in an adjoining position on the same semiconductor substrate.

As constructed above, in both TFTs, the thickness of thin gate insulating films, semiconductor films, and the like, the planar shapes of each component such as a channel length, impurity concentration in regions for forming channels, source regions and drain regions, temperature during operation and the like can easily become the same, so that the threshold voltage Vth1 and Vth2 of both TFTs can be completely or almost completely equalized. In addition, in making threshold characteristics similar, it is better to make channel lengths the same, but channel widths do not have to be the same.

Thus, according to this embodiment, by setting the threshold characteristics and voltage/current characteristics of the driving TFT 110 and the compensating TFT 120 close to each other (ideally the same), it is possible to set the threshold voltage Vth of input signals Vsig supplied to the driving current Id to approximately zero (ideally equal to zero).

Moreover, as seen from FIG. 3(A) and FIG. 3(B), in manufacturing a plurality of transistor circuits 100, even if threshold voltage Vth1 at each driving TFT 110 varies from each other, the threshold voltage Vth of each transistor circuit 100 is approximately zero by the operation of each compensating TFT 120 without being dependent on the level of this threshold voltage Vth1. In other words, a plurality of transistor circuits 100 with a constant threshold voltage Vth can be manufactured. This is particularly useful for a display panel and the like where a variance in threshold voltage Vth among a plurality of transistor circuits 100 is a problem as described below. Also, it is much easier to equalize the threshold voltage Vth1 of the driving TFT 110 and the threshold voltage Vth2 of the compensating TFT 120 that are a mutually adjoining pair at each transistor circuit 100 than to equalize the threshold voltage Vth1 of two driving TFTs 110 that are separately arranged with a gap therebetween, so that it is possible to say that the structure of compensating threshold voltage Vth1 in each transistor circuit 100 by the compensating TFT 120 is extremely effective, so as to reduce a variance in threshold voltage Vth among a plurality of transistor circuits 100 from each other.

As described above, according to this embodiment, even if a plurality of driving TFTs 110 with different threshold voltage Vth1 from a threshold voltage (for example, 2.5V) as a design standard level is used in preparing a plurality of transistor circuits 100, it becomes possible to provide a plurality of circuits 100 with little or no variance in threshold voltage Vth. Therefore, the requirements for TFTs regarding voltage/current characteristics are made easy, and it becomes possible to improve yields and lower manufacturing costs.

In addition, as seen from FIG. 3(A) and FIG. 3(B), by equalizing threshold voltages Vth1 and Vth2, the first effect where conductance control at each driving TFT 110 can be carried out by using a higher gate voltage Vg than the voltage Vsig of input signals Vsig and the second effect where a variance in threshold voltage Vth among a plurality of transistor circuits 100 are clearly achieved. However, even without completely equalizing the threshold voltage Vth1 of the driving TFT 110 and the threshold voltage Vth2 of the compensating TFT 120 in each transistor circuit 100, both threshold voltages characteristically will offset each other, so that these first and second effects are achieved to some degree, based on the similarity of both threshold voltages.

In this embodiment, particularly, it is constructed so as to supply reset signals Vrsig having a voltage in response to a higher conductance than the maximum conductance controlled in response to input signals Vsig to the gate 111. Therefore, it becomes possible to supply input signals Vsig to the gate 111 through the compensating TFT 120 that is connected to the gate 111 in an orientation, to permit electric charge to move into a direction so as to lower this conductance after resetting, without being dependent on the level of voltage Vsig of input signals Vsig. Also, in this embodiment, reset signals Vrsig are set at a higher voltage than the maximum voltage of input signals Vsig by the threshold voltage Vth2 level of the compensating TFT 120. Therefore, when input signals Vsig are input after resetting, a voltage higher than the voltage Vsig of input signals Vsig only by the threshold voltage Vth2 level of the compensating TFT 120 can always be supplied to the gate 111 without being dependent on the level of the voltage Vsig of input signals Vsig and the threshold voltage Vth2 of the compensating TFT 120.

Moreover, when the inversion of input signals Vsig is carried out as frequently applied in conventional liquid crystal display elements, it is desirable that the above-noted reset signal Vsig relations are achieved in all input signals Vsig, including inverse input signals.

Figure 4:
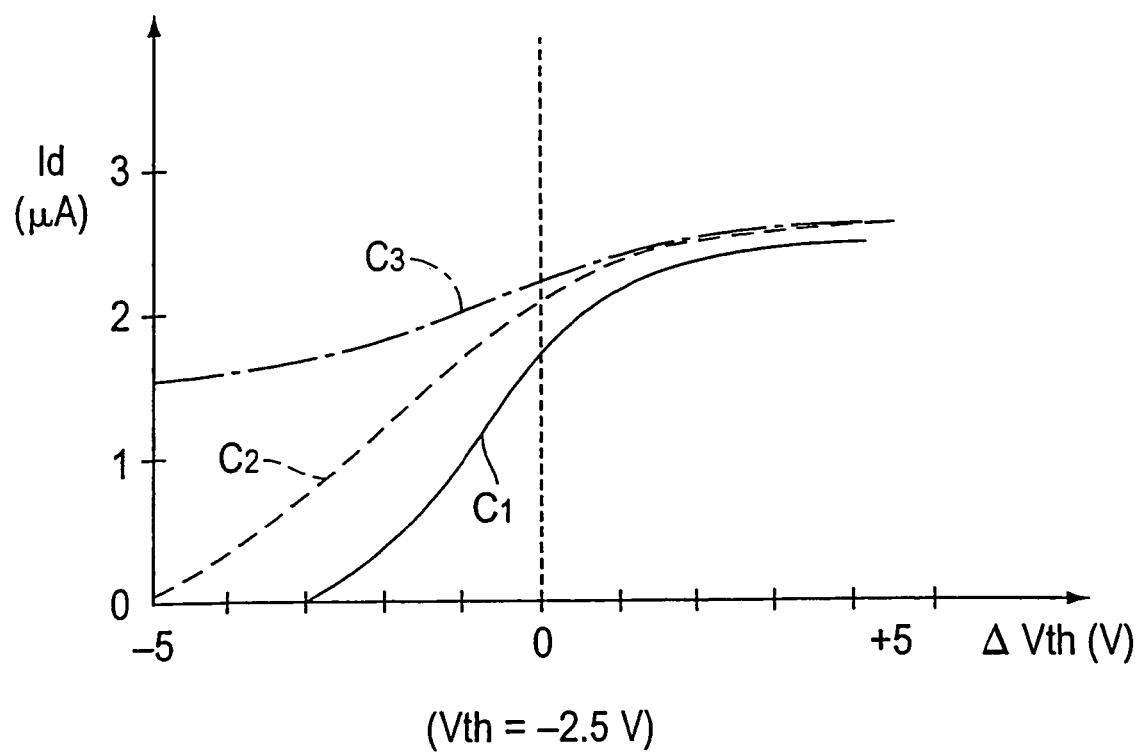
FIG. 4 is a characteristic diagram showing various cases of the fluctuation in driving current Id in response to the variance ΔVth of thresholds.
Figure 5A:
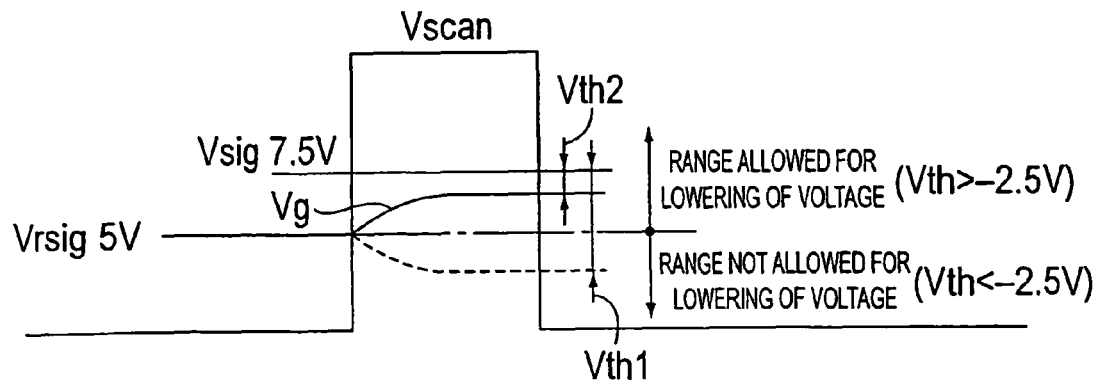
FIG. 5(A) is a timing chart showing dropping voltage operations by a compensating TFT when the reset signal Vrsig is set at 5V in the embodiment.
Figure 5B:
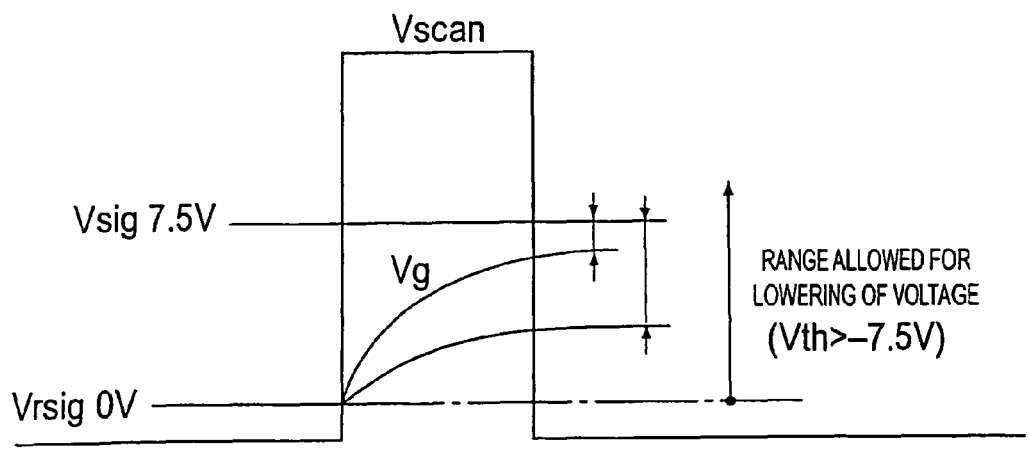
FIG. 5(B) is a timing chart showing dropping voltage operations by the compensating TFT when the reset signal Vrsig is set at 0V.

The effects of these reset signals Vrsig by voltage setting are examined with reference to FIGS. 4-5(B). Herein, FIG. 4 respectively shows the fluctuation in driving current relative to a variance ΔVth in threshold voltage from a design standard level that is, for instance, −2.5V (1) when input signals Vsig are supplied directly to the driving TFT 110 without the compensating TFT 120 (characteristic curve C1), (2) when input signals Vsig are supplied to the driving TFT 110 through the compensating TFT 120 at 5V of reset signal Vrsig (characteristic curve C2), and (3) when input signals Vsig are supplied to the driving TFT 110 through the compensating TFT 120 with reset signal Vrsig at 0V (characteristic curve C3). Also, FIG. 5(A) shows the fluctuation range of the gate voltage Vg corresponding to the characteristic curve C2, and FIG. 5(B) shows the fluctuation range of the gate voltage Vg corresponding to the characteristic curve C3. In addition, herein, Vsig is 7.5V; +Vc is 10V; and −Vc is 5V.

In FIG. 4, as indicated with the characteristic curve C1, the variance ΔVth in threshold voltage clearly appears directly as the variance in driving current Id in the case of having no compensating TFT 120.

As illustrated with the characteristic curve C2, when the compensating TFT is used at 5V of reset signal Vrsig, the variance ΔVth in threshold voltage is significantly compensated on the plus side, but appears as the variance in driving current Id at the minus side. This is because, as shown in FIG. 5(A), on the minus side, the gate voltage Vg cannot be made lower (or compensated) than the input signals Vsig by the threshold voltage Vth2 level to the negative voltage side, when the input signals Vsig are input after resetting. This is because the compensating TFT 120 acting as a diode can make the gate voltage Vg closer to the input signals Vsig from the reset signals Vrsig, but cannot do the opposite.

Also, as shown with the characteristic curve C3, when the compensating TFT is used with 0V of reset signal Vrsig, the variance ΔVth of threshold voltage hardly appears as the variance in driving current Id. This is because, as shown in FIG. 5(B), the gate voltage Vg can be made lower (or compensated) than the input signals Vsig only by threshold voltage Vth level to the negative voltage side, when the input signals Vsig are input after resetting. Moreover, if Vsig=7.5V applied herein is considered as the minimum electric potential of input signals Vsig, the above-noted examination is realized to make sure that all Vsig can be compensated.

As described above, in this embodiment, without being dependent on the level of input voltage Vsig and threshold Vth2 of the compensating TFT 110, a voltage Vg that is lower than the voltage of the input signals Vsig only by the threshold voltage Vth2 level of the compensating TFT 120 can be applied to the gate 111 of the driving TFT 110.

In addition, in FIG. 2(A) and FIG. 2(B), the gate voltage Vg is held by the storage capacitor capacity 160 during the driving period. Therefore, by the storage capacitor 160, a variance in holding characteristics of the gate voltage Vg among a plurality of transistor circuits 100 can be also reduced (compensated).

As explained with reference to FIG. 1 to FIG. 5B, according to the transistor circuit 100 of this embodiment, the current-controlled element 500 such as an EL element can be current-driven by input signals Vsig at a relatively low voltage; and moreover, without being dependent on a variance in voltage/current characteristics and threshold characteristics among a plurality of driving TFTs 110, a plurality of current-controlled elements 500 can be current-controlled with good precision in accordance with the voltage of input signals Vsig.

Moreover, the example shown in FIG. 1 is constructed with the mixture of a P channel type TFT and an N channel type TFT, however, every TFT can be N channel type TFTs or all TFTs can be P channel type TFTs. However, in consideration that the voltage/current characteristics and threshold characteristics of the driving TFTs 110 are compensated by the compensating TFT 120, it is advantageous to construct these driving TFTs 110 and compensating TFTs 120 by the same process as the same type TFTs. Particularly, if both TFTs are formed in the same film forming process, the degree of characteristic similarities between both TFTs generally increases, so that it becomes possible to provide the transistor circuit 100 on the same substrate with little or no variance in voltage/current characteristics and threshold characteristics. On the other hand, the resetting TFT 130 and the switching TFT 140 can be either a P channel type TFT or an N channel type TFT without being dependent on whether the driving TFT 110 is a P channel type TFT or N channel type TFT. However, it is often advantageous in manufacturing when all TFTs are of the same type.

Also, each type of TFTs 110-140 in this embodiment may be any type of field effect transistor (FET) such as joining type, parallel/serial connection type, and the like.

Figure 6:
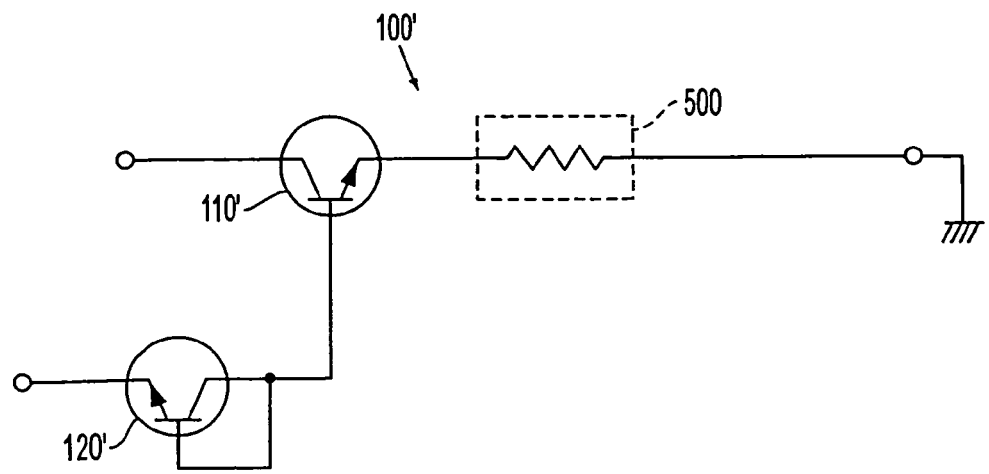
FIG. 6 is a circuit diagram in another embodiment of a transistor circuit of the invention.

Furthermore, as shown in FIG. 6, the above-noted transistor circuit may consist of bipolar transistors. In this case, by corresponding the above-mentioned gate, source and drain to a base, an emitter and a collector respectively, a driving transistor 110' is constructed from a bipolar transistor, and at the same time, a compensating transistor 120' is constructed from a bipolar transistor, thus providing a transistor circuit 100'. Generally, in the case of bipolar transistors, the variance in threshold voltage with e.g., 0.7V as a center is smaller than that of TFTs, however, even if constructed as above, the effect of variance in voltage/current characteristics and threshold characteristics in the driving transistor 110' on the driving current Id can be compensated by the compensating transistor 120'. Furthermore, driving can be carried out by the driving transistor 110' at a relatively low voltage. Particularly, when the driving transistor 110' and the compensating transistor 120' are manufactured in the same manufacturing process, the degree of characteristic similarities between both transistors generally increases, so that it becomes possible to provide a plurality of transistor circuits 100' with little or reduced variance in voltage/current characteristics and threshold characteristics.

As the current-controlled element 500 in the embodiment mentioned above, various elements including current-controlled light-emitting elements such as an organic EL element and an inorganic EL element, a current-controlled heat transfer element, and the like, are included.

(Display Panel)

Figure 7:
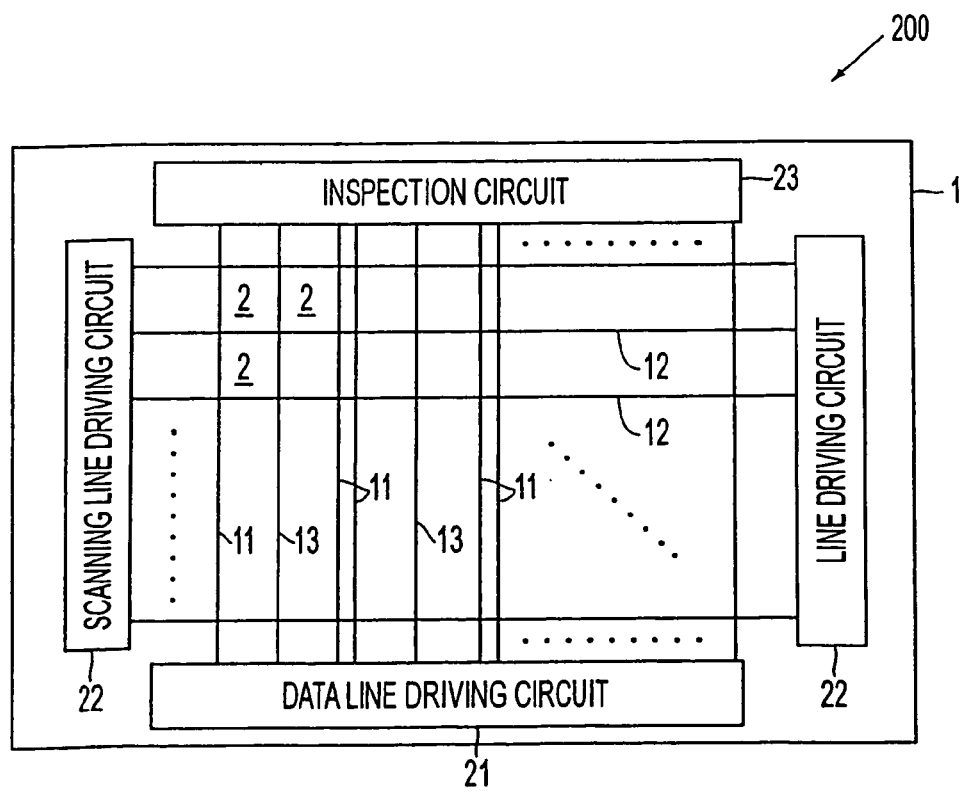
FIG. 7 is a planar view showing an entire structure in one embodiment of a display panel of the invention.
Figure 8:
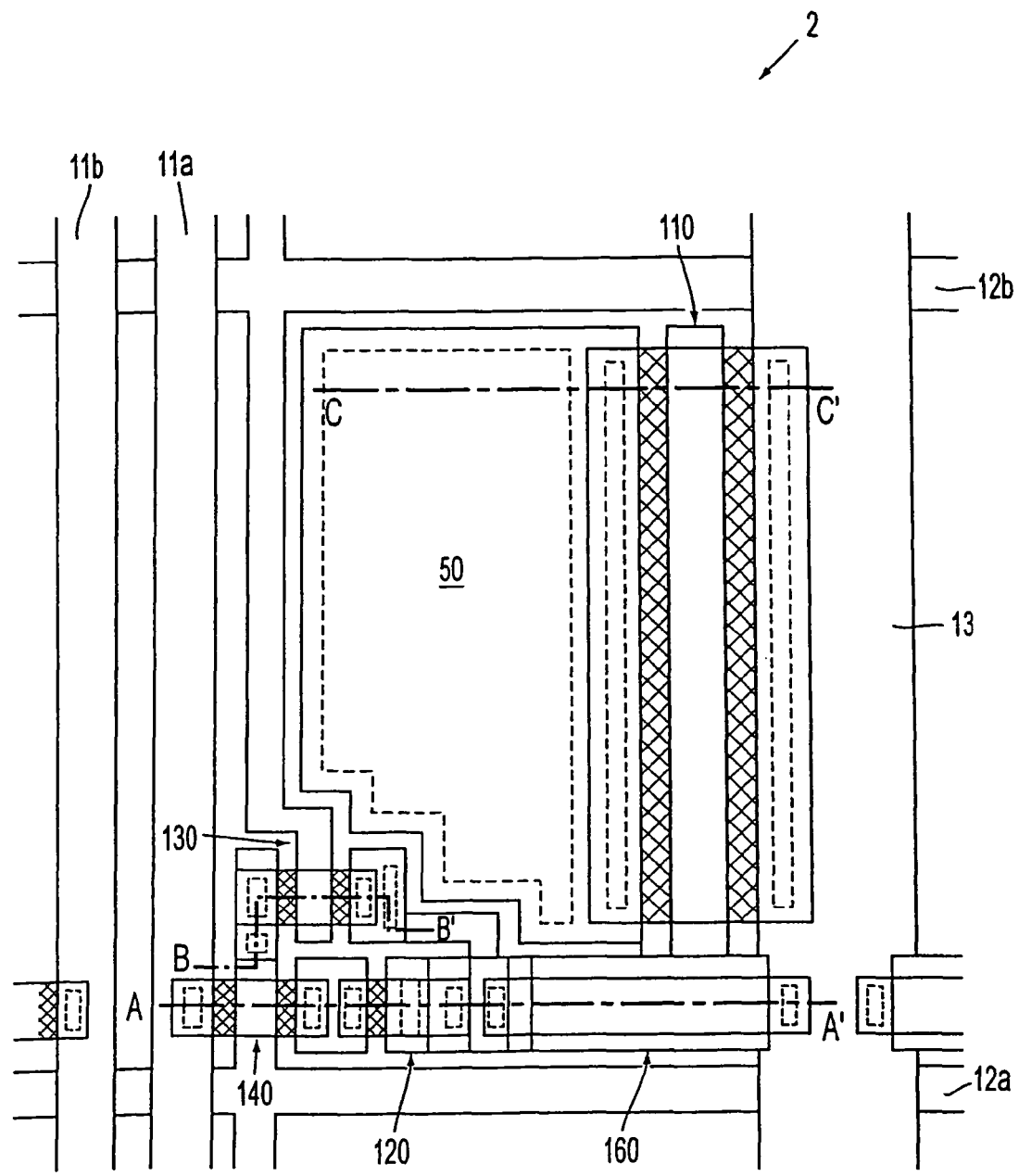
FIG. 8 is a planar view of one picture element of the display panel of FIG. 7.
Figure 9A:
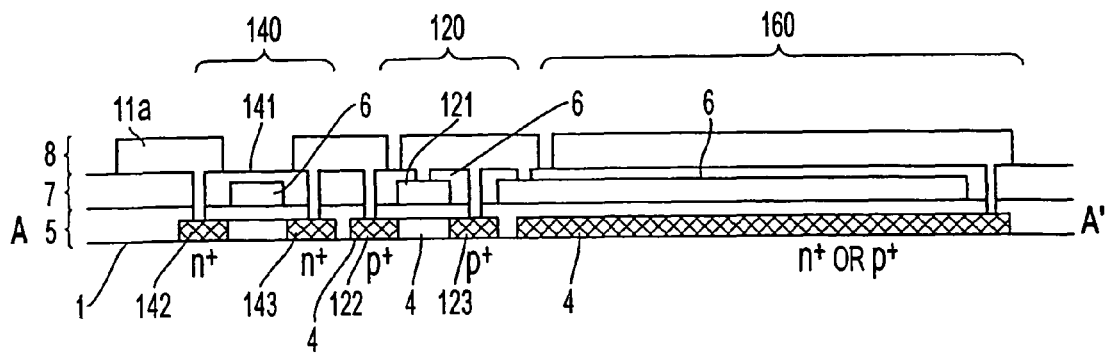
FIG. 9(A) is a cross-sectional view taken on line A-A' of FIG. 8.
Figure 9B:
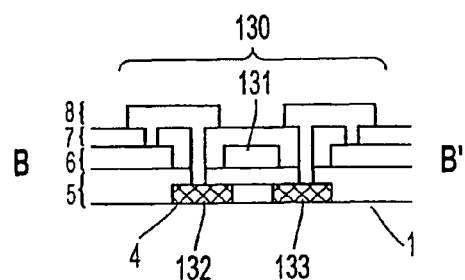
FIG. 9(B) is a cross-sectional view taken on line B-B'.
Figure 9C:
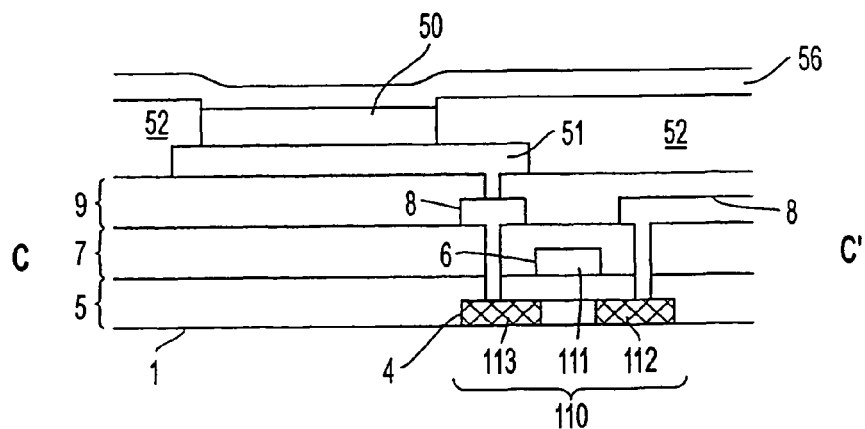
FIG. 9(C) is a cross-sectional view taken on line C-C'.
Figure 10:
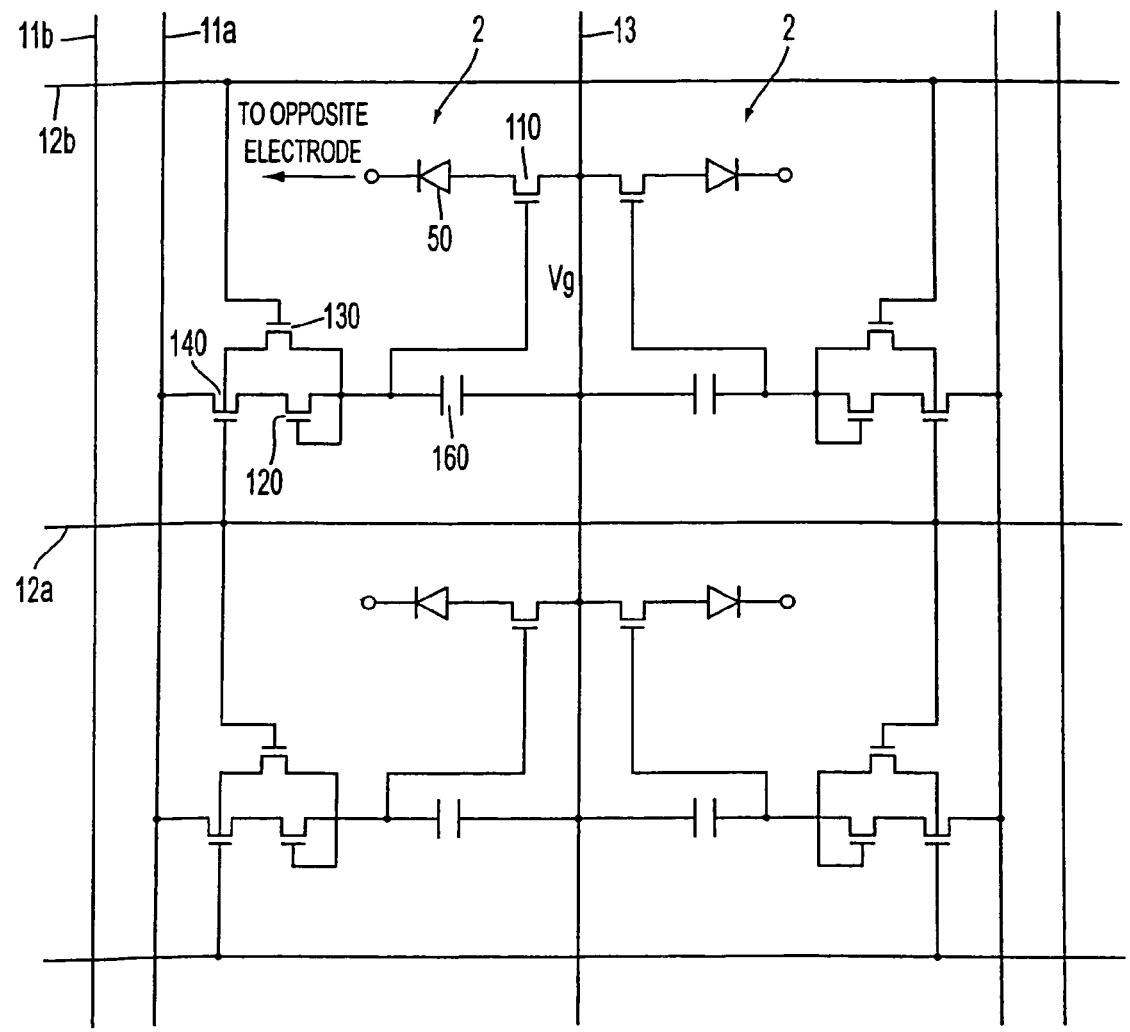
FIG. 10 is a circuit diagram of four adjoining picture elements in the display panel of FIG. 7.

The embodiments of a display panel of this invention is explained with reference to FIG. 7 to FIG. 10. FIG. 7 is a block diagram showing the entire structure of a display panel; FIG. 8 is a planar view of one picture element in the display panel; FIG. 9(A), FIG. 9(B) and FIG. 9(C) are respectively a cross-sectional view on line A-A', a cross-sectional view on line B-B' and a cross sectional view on line C-C' thereof; and FIG. 10 is a circuit diagram of four picture elements adjoining each other.

The display panel in this embodiment includes the above-noted transistor circuits of this invention, respectively, and a plurality of picture elements arranged in a matrix; and at the plurality of picture elements, EL elements 50 are arranged respectively as an example of current-controlled light-emitting elements.

As shown in FIG. 7, a display panel 200 has a TFT array substrate 1, a plurality of data lines 11 extending in the Y direction and arranged in the X direction in a picture display area wherein a plurality of picture elements 2 are arranged in a matrix on the TFT array substrate, a plurality of scanning lines 12 extending respectively in the X direction and arranged in the Y direction, and a plurality of common electric wires 13 arranged in parallel to the plurality of data lines 11. The display panel 1 further has a data line driving circuit 21 around the picture display area for supplying data signals to each data line 11, a pair of scanning line driving circuits 22 for supplying scanning signals to each scanning line 12, and an inspecting circuit 23 for inspecting conductance failure, insulation failure, defects of elements, and the like in each picture element 2. In addition, in this embodiment, each driving circuit is formed on the TFT array substrate 1 along with a picture element 2 in the same process, but it can be a circuit that is not formed on the TFT array substrate 1 or may be formed in a different process from the picture element 2.

As shown in FIG. 8, at each picture element 2, the driving TFT 110, the compensating TFT 120, the resetting TFT 130, the switching TFT 140 and the storage capacitor 160 that are explained above with reference to FIG. 1 to FIG. 6 are arranged. Moreover, a scanning line 12b in a previous stage becomes the wiring for reset scanning signals Vrscan in FIG. 1; a scanning line 12a in this stage becomes the wiring for scanning signals Vscan and for reset signals Vrsig in FIG. 1; and a data line 11a in this stage becomes the wiring for input signals Vsig (data signals) in FIG. 1. Furthermore, the common electric wire 13 is connected to a positive power source +V; an EL element 50 is connected between the driving TFT 110 and a counter electrode to be mentioned later; and the counter electrode is connected to a negative power supply –V.

As shown in FIG. 9(A), the switching TFT 140, the compensating TFT 120 and the storage capacitor 160, along an A-A' cross section in FIG. 8, consist of a semiconductor film (polysilicon film) 4 on the TFT array substrate 1, a gate insulating film 5 consisting of a silicon oxide film or a silicon nitride film, a Ta (tantalum) film 6, a first interlayer insulating film 7 consisting of a silicon oxide film or a silicon nitride film, and an Al film 8. In addition, instead of the Ta film for forming gate electrodes, a low-resistance polysilicon film may be formed.

More specifically, the switching TFT 140 is a top gate type TFT having a gate 141 made of the polysilicon film 6, and is formed as an N channel type TFT having a semiconductor layer 4 countering the gate 141 through the gate insulating film 5 as a channel forming area and having a source 142 and a drain 143 that are doped at high concentration in the n type on both sides of the area. Also, the source 142 is connected to a data line 11a made of an Al film 8 through contact holes formed in the gate insulating film 5 and the first interlayer insulating film 7. Moreover, the drain 143 is connected to the compensating TFT 120 through contact holes formed in the gate insulating film 5 and the first interlayer insulating film 7 as well as the Al film 8.

The compensating TFT 120 is a top gate type TFT having a gate 121 made of a Ta film 6, and is formed as a P channel type TFT having a semiconductor film 4 countering the gate 121 through the gate insulating film 5 as a channel forming area and having a source 122 and a drain 123 that are doped at high concentration in the p type on both sides of the area. Also, the TFT is connected to the switching TFT 140, the storage capacitor 160 and the gate 111 of the driving TFT 110 through the contact holes formed in the gate insulating film 5 and the first interlayer insulating film 7 and the Al film 8.

In addition, the storage capacitor 160, so as to have a double capacitor structure, is formed in that the semiconductor film 4, the Ta film 6 and the Al film 8 are counter-arranged with the gate insulating film 5 and the first interlayer insulating film 7 respectively therebetween. Also, the semiconductor film 4 constituting a storage capacitor is connected to the Al film 8 through the contact holes formed in the gate insulating film 5 and the first interlayer insulating film 7; and the Ta film 6 constituting a storage capacitor is connected to the Al film 8 through the contact holes formed in the first interlayer insulating film 7.

As shown in FIG. 9(B), the resetting TFT 130, along a B-B' cross section in FIG. 8, consists of a semiconductor film 4, a gate insulating film 5, a Ta film 6, a first interlayer insulating film 7 and an Al film 8 on a TFT array substrate 1.

More specifically, the resetting TFT 130 is a top gate type TFT having a gate 131 made of a Ta film 6, and is formed as an N channel type TFT having a semiconductor layer 4 facing the gate 131 through the gate insulating film 5 as a channel forming area and having a source 132 and a drain 133 that are doped at high concentration in the n type on both sides of the area. Also, the source 132 and the drain 133 are connected respectively to a scanning line 12a in this stage made of a Ta film 6 and the gate 111 of the driving TFT 110 through the contact holes formed in the gate insulating film 5, the first interlayer insulating film 7 and the Al film 8.

Moreover, as shown in FIG. 9(C), the driving TFT 110, along a C-C' cross section in FIG. 8, consists of a semiconductor film 4, a gate film 5, a Ta film 6, a first interlayer insulating film 7 and an Al film 8 on a TFT array substrate 1. Also, on a second interlayer insulating film 9, an ITO film 51 is formed that is connected to the drain 113 of the driving TFT 110 through contact holes and the Al film 8, and an EL element 50 is formed thereon. On the other hand, the source 112 of the driving TFT 110 is connected to a common electric wire 13 made of the Al film 8 through contact holes. Also, EL elements 50 at adjoining picture elements 2 are separated from each other by electrically insulating banks 52. Preferably, the banks have a shielding property. The banks 52 are made of, for instance, a shielding resist, and the bank 52 may be provided even at a peripheral parting area surrounding the picture display area of the display panel 200. In addition, on the EL element 50, a counter electrode (top electrode) 56 is arranged that is made of a low-resistance metal such as Al or ITO, and the like.

As shown in FIG. 10, the display panel 200 particularly has a structure wherein positive power source +V is supplied to both picture elements 2 which are mutually adjoining in the X direction by the common electric wire 13; and compared with the case wherein power source wiring for supplying positive power source +V is simply provided for each of picture elements 2, the number of power source wiring is about ½. Moreover, having a structure wherein reset scanning signals Vrscan input to the gate 131 of the resetting TFT 130 are supplied by a scanning line 12b in the previous stage and reset signals Vrsig input to the resetting TFT 130 are supplied by a scanning line 12b in the current stage, the number of signal wiring is reduced compared with the case wherein wiring only for reset scanning signals Vrscan and wiring only for reset signals Vrsig are provided. Therefore, without increasing the number of power source wiring and signal wiring, a space for the compensating TFT 120 and the resetting TFT 130 that is not provided in conventional display panels can be kept. There is no doubt that the ideas of this invention are applicable to the ones, different from this embodiment, wherein patterns are made the same for each picture element by providing a common electric wire per picture element or wherein wiring only for reset scanning signals Vrscan and wiring only for reset signals Vrsig are provided.

In addition, in the case of the display panel 200 wherein the EL elements 50 are used as current-driven light-emitting elements as in this embodiment, unlike liquid crystal panels, and the like, the panel emits its own light in response to the increase in electric current supplied to the light-emitting elements without increasing the entire area of picture elements, so that brightness necessary for picture image display can be obtained. Thus, as in this embodiment, it is possible to maintain a space for forming various TFTs in a picture element 2 by saving a wiring area, or a space for forming various TFTs in a picture element 2 may be kept by reducing the size of each EL element 50.

Next, the operation of the display panel 200 of this embodiment is explained with reference to FIG. 7 and FIG. 10.

When scanning signals Vscan are supplied to a scanning line 12b in a previous stage from a scanning line driving circuit 22, they are input to the gate 131 of the resetting TFT 130 in the current stage as reset scanning signals Vrscan in the current stage. At the same time, reset signals Vrsig are supplied from the scanning line driving circuit 22 to a scanning line 12a in the current stage, and the gate voltage Vg of the driving TFT 110 in the current stage becomes the electric potential of reset signals Vrsig (see FIG. 2(A)). At this time, the reset signals Vrsig may be the same as the OFF-state electric potential of scanning signals Vscan. When the scanning signals Vscan are continuously supplied from the scanning line driving circuit 22 to the scanning line 12a in the current stage, they are then input to the gate 141 of the switching TFT 140 in the current stage. At the same time, input signals Vsig (data signals) are supplied from a data line driving circuit 21 to a data line 11a in the current stage, and this voltage Vsig is dropped only by a threshold voltage Vth2 of the compensating TFT 120 through the switching TFT 140 and the compensating TFT 120, and is then supplied as a gate voltage Vg to the gate 111 of the driving TFT 110 in the current stage (see FIG. 2(A)). As a result, in response to this dropped gate voltage Vg, conductance between the source 112 and the drain 113 of the driving TFT 110 is controlled between positive power source +V and negative power source −V. The driving current Id flowing to the EL element 50 is then controlled.

Therefore, a variance in threshold voltage Vth1 of the driving TFT 110 at each picture element 2 is compensated by a threshold Vth2 of the compensating TFT 120, and the variance in thresholds of data signals Vsig in response to the driving current Id among a plurality of picture elements 2 is almost gone, so that even picture images are displayed with even brightness over the entire picture display area of the display panel 200. It is also possible to control the driving current Id with data signals Vsig having a relatively small voltage due to the dropping voltage operation of the compensating TFT 120.

In the above-noted embodiment, the gate voltage Vg is reset by the resetting TFT 130 before input signals Vsig are supplied, however, for instance, in the display period of a static picture, the control of driving current Id can be carried out over a plurality of frames by the same input signals Vsig, so that it is unnecessary to carry out resetting operations for each scanning. Also, instead of these electrically reset signals Vrsig, the gate voltage Vg may be reset (to be a predetermined reset voltage) by light irradiation. Furthermore, instead of the resetting TFT 130, reset signals Vrsig may be supplied through the switching TFT 140 and the compensating TFT 120. On the other hand, of course, the switching TFT 140 and switching operations will be unnecessary if switching such as active matrix driving is not carried out.

(Electronic Apparatus)

Next, the electronic apparatus of the embodiment having the display panel 200 which was explained above in detail will be explained with reference to FIG. 11 to FIG. 13.

Figure 11:
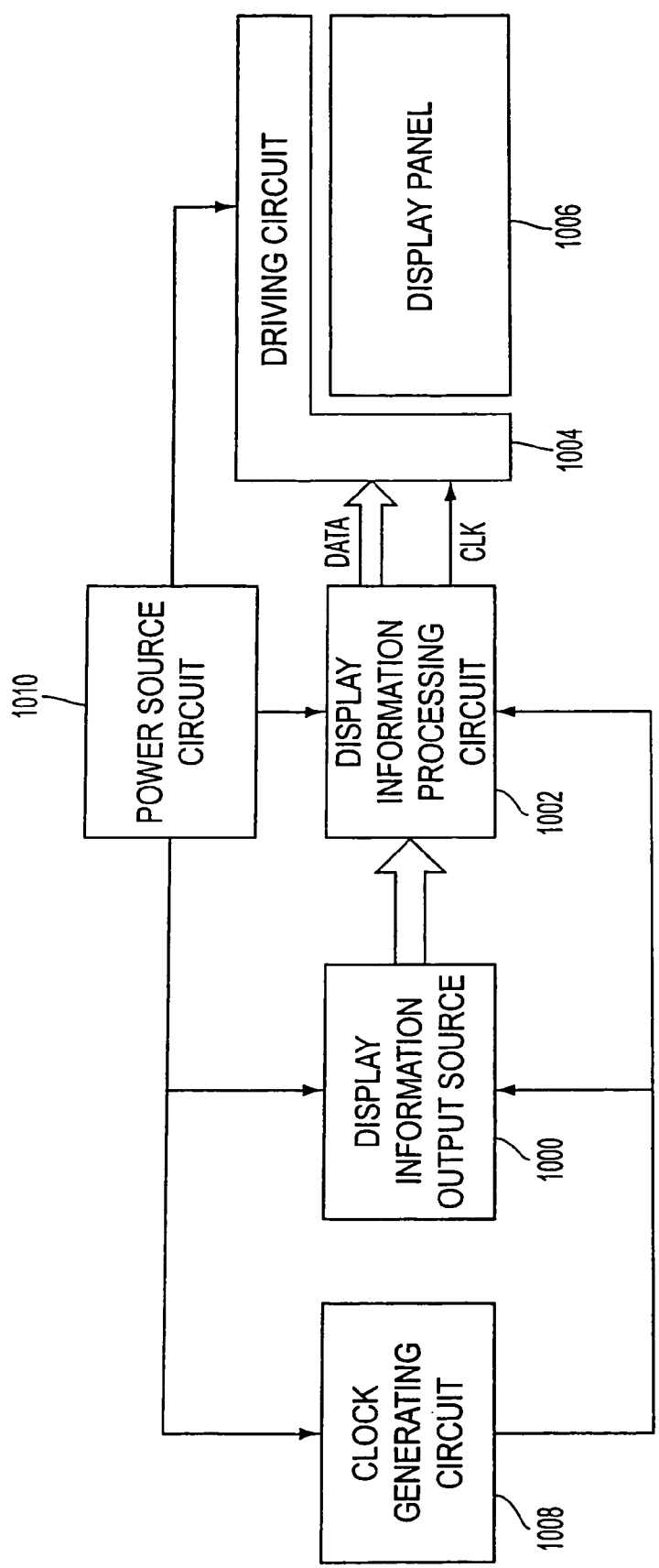
FIG. 11 is a block diagram showing a schematic structure in one embodiment of an electronic apparatus of this invention.

First, FIG. 11 shows the schematic structure of an electronic apparatus having the display panel 200 as mentioned above.

In FIG. 11, the electronic device includes a display information output source 1000, a display information processing circuit 1002, a driving circuit 1004, a display panel 1006, a clock generating circuit 1008 and a power source circuit 1010.

The display panel 200 in the above-noted embodiment is equivalent to the display panel 1006 and the driving circuit 1004 in this embodiment. Therefore, the driving circuit 1004 may be installed on a TFT array substrate of the display panel 1006, and moreover, the display information processing circuit 1002, and the like may be installed. Alternatively, the driving circuit 1004 may be fixed externally onto a TFT array substrate on which the display panel 1006 is installed.

The display information output source 1000 includes a memory such as ROM (Read Only Memory), RAM (Random Access Memory) and an optical disk device, a tuning circuit for tuning television signals and then outputting the signals, and the like; and based on clock signals from the clock generating circuit 1008, display information such as the picture image signals of a predetermined format is output to the display information processing circuit 1002. The display information processing circuit 1002 includes various conventional processing circuits such as an amplifying/inversion circuit, a phase developing circuit, a rotation circuit, a gamma control circuit and a clamp circuit; and digital signals are sequentially formed from display information that is input based on clock signals and are then output to the driving circuit 1004 along with clock signals CLK. The driving circuit 1004 drives the display panel 1006. The power source circuit 1010 supplies a predetermined power source to each circuit mentioned above.

Figure 12:
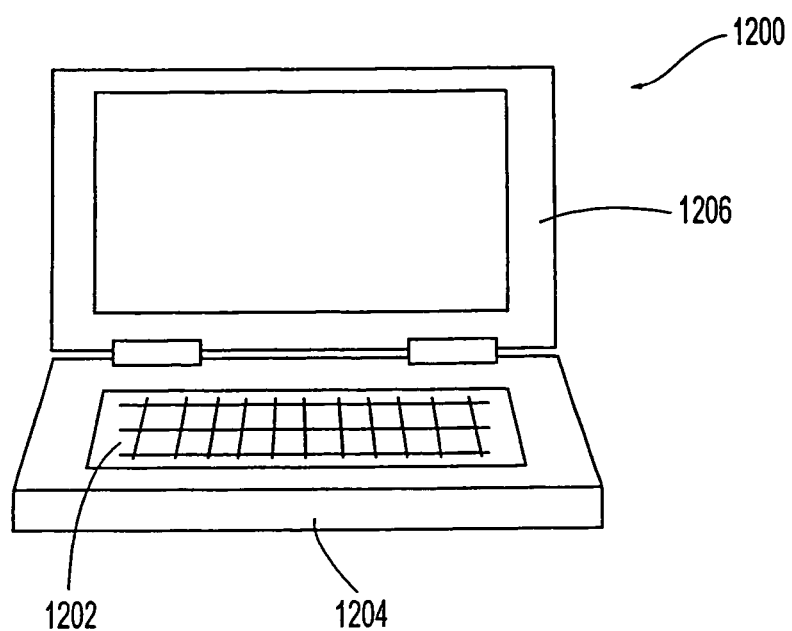
FIG. 12 is a front view of a personal computer as an example of an electronic apparatus.
Figure 13:
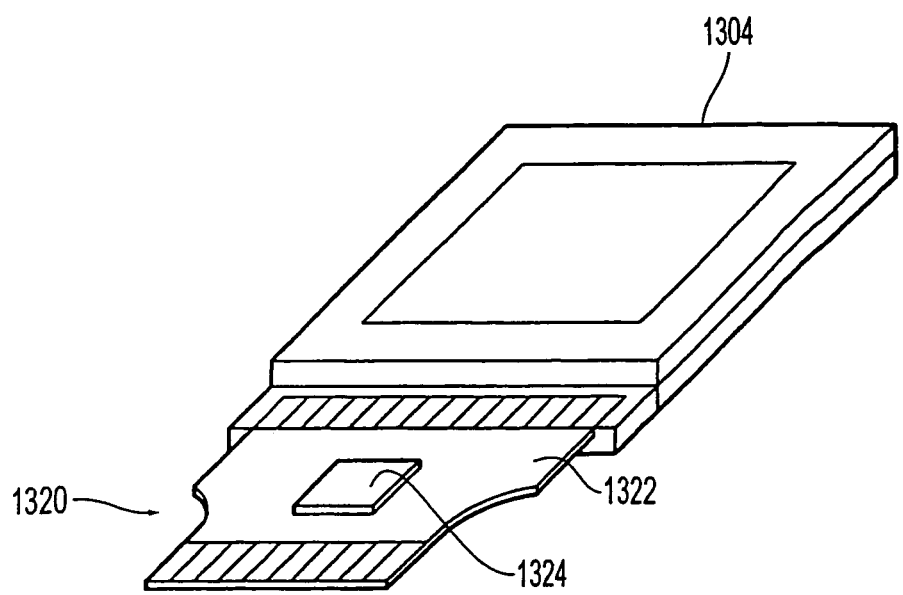
FIG. 13 is a perspective diagram showing a liquid crystal device using a TCP as another example of an electronic apparatus.

Next, the specific examples of the electronic apparatus prepared as above are shown respectively in FIG. 12 and FIG. 13.

In FIG. 12, as another example of the electronic apparatus, a multimedia laptop personal computer (PC) 1200 has the above-noted display panel 200 in a top cover case 1206, and further includes a main body 1204 having a CPU, a memory, a modem, and the like and a built-in keyboard 1202.

Also, as shown in FIG. 13, in the case of a display panel 1304 with no built-in driving circuit 1004 and display information processing circuit 1002, an IC1324 containing the driving circuit 1004 and the display information processing circuit 1002 is physically and electrically connected to a TCP (Tape Carrier Package) 1320 through an anisotropic conductive film 1322 arranged at the periphery of the TFT array substrate 1, and can be manufactured, sold, used, etc. as a display panel.

As explained above, according to this embodiment, various electronic apparatuses are provided that can be driven at a relatively low voltage and with little unevenness in brightness over the entire surface of a display panel.

According to the transistor circuits of this invention, the gate voltage can be reduced or increased relative to the voltage of input signals only by a threshold voltage of a compensating transistor, so that conductance control in the driving transistor can be carried out by a dropped voltage of input signals. Moreover, by making the threshold characteristics and voltage/current characteristics of a compensating transistor and a driving transistor similar, the threshold voltage of input signals to driving current can become approximately zero. Furthermore, in the case a plurality of the transistor circuits is prepared by applying a plurality of driving transistors with different threshold characteristics, even if a plurality of driving transistors with many different threshold voltages are applied, in other words, a plurality of driving transistors having various threshold voltages relative to a design standard level, it is also possible to provide a plurality of transistor circuits with almost no variance or no variance at all in threshold voltage in the plurality of transistor circuits.

According to the display panel of this invention, a picture image display with reduced unevenness in brightness is achieved by applying low voltage input signals.

INDUSTRIAL APPLICABILITY

A display panel is provided that can display picture images with reduced unevenness in brightness, from the transistor circuits of this invention; and the display panel is useful for electronic devices such as laptop personal computers (PC), televisions, view finder or monitor display-type video tape recorders, car navigation devices, electronic notebooks, calculators, word processors, engineering workstations (EWS), cellular phones, TV telephones, POS terminals, pagers, devices with touch panels, and the like.

The invention claimed is:

1. A driving method for a display having a transistor circuit that includes a light-emitting element, and a driving transistor controlling a current flowing through the light-emitting element, the method comprising:
    compensating a data signal for a threshold voltage of the driving transistor by passing the data signal through a diode-connected transistor configuration when the data signal is supplied to the transistor circuit; and
    controlling the current flowing through the light-emitting element by the driving transistor, a gate voltage of the driving transistor is set at a level being obtained by the compensating,
    wherein the diode-connected transistor configuration is defined as any transistor, having a gate and at least one of a source and a drain, while its gate is connected to either its source or its drain.

2. The driving method of claim 1, further comprising a step of resetting the gate voltage of the driving transistor before compensating for the threshold voltage of the driving transistor.

3. A driving method for a display including a scanning line, a data line, and a pixel including a light-emitting element and a transistor circuit including a driving transistor controlling a current flowing through the light-emitting element, and a switching transistor connected between the data line and the driving transistor, the method comprising:
    compensating a data signal for a threshold voltage of the driving transistor by passing the data signal through a diode-connected transistor configuration when the switching transistor is turned on based on a scanning signal supplied from the scanning line, for supplying the data signal to a gate of the driving transistor from the data line; and
    controlling the current flowing through the light-emitting element by the driving transistor, a voltage of the gate of the driving transistor being set at a level obtained by the compensating,
    wherein the diode-connected transistor configuration is defined as any transistor, having a gate and at least one of a source and a drain, while its gate is connected to either its source or its drain.

4. The driving method according to claim 3, further comprising supplying a reset signal to the transistor circuit before supplying the data signal to the transistor circuit.

5. A driving method for a display including a light-emitting element and a transistor circuit that includes a driving transistor controlling a current flowing through the light-emitting element, the method comprising:
    compensating a data signal for a threshold voltage of the driving transistor by passing the data signal through a diode-connected transistor configuration when the data signal is supplied to the transistor circuit; and
    controlling the current flowing through the light-emitting element by the driving transistor, a gate voltage of the driving transistor is obtained based on the data signal and the threshold voltage,
    wherein the diode-connected transistor configuration is defined as any transistor, having a gate and at least one of a source and a drain, while its gate is connected to either its source or its drain.

6. The driving method according to claim 3, the data signal being supplied to a gate of the driving transistor through a compensating transistor.

* * * * *